United States Patent
Krahn et al.

(10) Patent No.: US 10,712,410 B2
(45) Date of Patent: Jul. 14, 2020

(54) NMR-MAS PROBE HEAD WITH PIVOTABLE STATOR

(71) Applicant: Bruker BioSpin GmbH, Rheinstetten (DE)

(72) Inventors: Alexander Krahn, Karlsruhe (DE); David Osen, Ettlingen (DE); Armin Purea, Bad Schoenborn (DE); Markus Mayer, Gossau (CH); Roger Meister, Hinteregg (CH)

(73) Assignee: BRUKER BIOSPIN GMBH, Rheinstetten (DE)

( * ) Notice: Subject to any disclaimer, the term of this patent is extended or adjusted under 35 U.S.C. 154(b) by 0 days.

(21) Appl. No.: 16/271,032

(22) Filed: Feb. 8, 2019

(65) Prior Publication Data
US 2019/0242958 A1 Aug. 8, 2019

(30) Foreign Application Priority Data
Feb. 8, 2018 (DE) .................. 10 2018 202 002

(51) Int. Cl.
*G01R 33/30* (2006.01)
(52) U.S. Cl.
CPC .................. *G01R 33/307* (2013.01)
(58) Field of Classification Search
CPC .............................. G01R 33/30; G01R 33/307
USPC .................................................. 324/318, 321
See application file for complete search history.

(56) References Cited

U.S. PATENT DOCUMENTS

| | | | |
|---|---|---|---|
| 7,915,893 B2 | 3/2011 | Shevgoor et al. | |
| 9,778,331 B2 | 10/2017 | Hunkeler et al. | |
| 9,903,923 B2 | 2/2018 | Schell et al. | |
| 9,945,645 B2 | 4/2018 | Freytag | |
| 10,132,881 B2 | 11/2018 | Osen et al. | |
| 10,261,143 B2 | 4/2019 | Freytag et al. | |
| 2010/0097060 A1 | 4/2010 | Johannessen et al. | |
| 2010/0109666 A1* | 5/2010 | Armbruster | G01R 33/307 324/318 |
| 2013/0207656 A1* | 8/2013 | Shinagawa | G01R 33/307 324/321 |

(Continued)

FOREIGN PATENT DOCUMENTS

| | | |
|---|---|---|
| CN | 106918792 A | 7/2017 |
| CN | 107121651 A | 9/2017 |
| DE | 102013201110 B3 | 4/2014 |

(Continued)

*Primary Examiner* — Steven L Yeninas
(74) *Attorney, Agent, or Firm* — Edell, Shapiro & Finnan, LLC

(57) ABSTRACT

A probe head (1) of an NMR-MAS assembly has a stator (2) with an opening (4) receiving a rotor (3) which, in a measuring position, rotates at the magic angle to the $B_0$ field. The stator is pivotable between the measuring position and a loading position of the rotor. A detection device (5) permits external, contactless identification of whether the opening of the stator is fitted with a rotor. The detection device has a light source (5a), from which light is introduced into a lower end (6") of a light guide (6). The stator has a first bore (2a), in which a first light guide stump (7a) is positioned such that, in the loading position of the stator, it produces an optical connection between a rotor inserted in the stator and an upper end (6') of the light guide opposite the lower end.

18 Claims, 3 Drawing Sheets

(56) References Cited

U.S. PATENT DOCUMENTS

2013/0257432 A1\* 10/2013 Hu ..................... G01R 33/307
324/322
2014/0125340 A1\* 5/2014 Hunkeler ............. G01R 33/307
324/321

FOREIGN PATENT DOCUMENTS

DE 102014201076 B3 3/2015
EP 3093679 B1 10/2017

\* cited by examiner

NMR-MAS PROBE HEAD WITH PIVOTABLE STATOR

CROSS REFERENCE TO RELATED APPLICATIONS

This application claims foreign priority under 35 U.S.C. § 119(a)-(d) to German Application No. 10 2018 202 002.7 filed on Feb. 8, 2018, the entire contents of which are hereby incorporated into the present application by reference.

FIELD OF INVENTION

The invention concerns a probe head of a nuclear magnetic resonance (=NMR) magic-angle spinning (=MAS) assembly comprising a MAS stator for receiving a MAS rotor, which can be set in rotation in a measuring position in which the cylinder axis of the MAS rotor is at the magic angle to a $B_0$ field of the NMR-MAS assembly, wherein the MAS stator comprises an opening for inserting a MAS rotor, wherein the MAS stator is arranged in the NMR-MAS probe head in such a way that it can be pivoted between the measuring position and a loading position, in which a MAS rotor can be inserted into the MAS stator.

An NMR-MAS probe head of this kind is known from DE 10 2013 201 110 B3 (=reference [1]).

BACKGROUND

NMR spectroscopy is a powerful analysis method. HF (=high-frequency) pulses are irradiated into a measurement sample, which is in a strong static magnetic field, whereby nuclear spin is aligned in the measurement substance, and the HF reaction of the measurement sample is measured. Information is thus obtained integrally over a certain region of the measurement sample, known as the active volume, and is analyzed in order to determine the chemical composition of the measurement sample.

In order to reduce line broadening on account of anisotropic interactions, it is known to allow an NMR sample to rotate at high frequency (typically several kHz) during the spectroscopic measurement, tilted at what is known as the "magic angle" of $\arctan\sqrt{2} \approx 54.70°$ relative to the static magnetic field. To this end, the sample is filled into a MAS rotor. MAS rotors are generally cylindrical tubes open on one side, which are closed by a cap, wherein the cap is provided with wing elements. The MAS rotor is arranged in a MAS stator, and the MAS rotor is driven with gas pressure via the wing elements for the rotation.

Document EP 3 093 679 B1 (=reference [2]) describes an NMR-MAS probe head having all physical components of the generic probe head defined at the outset, which probe head however—contrary to the teaching of reference [1]—is not pivotable. The loading and unloading of the MAS stator with a MAS rotor containing a new NMR sample before and after each NMR measurement is thus relatively complicated each time, since the stator cannot be brought into an optimized loading position for the insertion of the rotor with the receiving opening generally arranged parallel to the z-axis of the NMR magnet system, but instead always remains in a position inclined relative thereto.

Document DE 10 2014 201 076 B3 (=reference [3]) also describes an NMR-MAS probe head in which the MAS stator likewise is formed non-pivotably. In addition, reference [3] however also discloses an embodiment of this probe head in which an additional device is provided which makes it possible to identify from outside whether a transport container is currently fitted with an NMR-MAS rotor. To this end, an additional mechanical component is moved by the MAS rotor inserted into the transport container in such a way that it is possible to identify from outside on the transport container, visually or with sensors, whether or not the transport container is fitted with a MAS rotor.

In U.S. Pat. No. 7,915,893 B2 (=reference [4]) an NMR-MAS probe head for a CryoMAS probe is disclosed, in which the MAS stator is again arranged non-pivotably in the probe head, but a contactless optical measurement of the rotational frequency of the MAS rotor is possible in the operating state.

In contrast to the three references [2] to [4] discussed above, the document DE 10 2013 201 110 B3 (=reference [1]) cited at the outset discloses an NMR-MAS probe head—generic in respect of the present invention—in which the MAS stator is mounted pivotably in the probe head in order to reduce the curve of the movement of the MAS rotor as it is inserted into the MAS stator, and vice versa. For transfer, the MAS stator should then be pivoted about the magnetic center. This probe head should thus be able to be made even more compact.

This generic probe head with the features defined at the outset still has the following disruptive disadvantages, however:

On the one hand it is not possible to mount a mechanical device for identifying the loading state of the MAS stator, as is proposed in reference [3]. Specifically, this device presumably would not survive a pivoting of the MAS stator over a relatively large angle between a measuring position and a loading position—as proposed in reference [1]—without sustaining damage, and certainly not after multiple pivoting operations.

The—desirable—pivotability of the MAS stator, however, also conflicts with a frequency detection of the MAS rotor rotating in the operating state during an NMR measurement, as proposed in reference [4]. A stationary light guide would inevitably break at its MAS stator-side end—at least after a number of pivoting operations of the MAS stator. The same would presumably also occur with use of a wire instead of the light guide for an electrical, instead of optical, frequency detection.

A loading recognition according to reference [3] in which, however, an electrical feed or an optical light guide according to reference [4] would be used for the MAS stator instead of the mechanical device proposed in reference [3] would also only be possible with a non-pivotable MAS stator for the reasons cited above, because otherwise a high risk of breakage of the guide elements on the moved MAS stator would have to be reckoned with.

It is nevertheless desirable to provide an at least optical detection device for MAS probe heads with pivotable MAS stator which do not have these disadvantages, such that for example a—usually relatively brittle—light guide is not exposed to any threatening mechanical stressing and therefore is not at high risk of breakage, even during continuous operation.

SUMMARY

It is an object of the present invention, in contrast, to provide an NMR-MAS probe head of the kind defined at the outset, having a pivotable MAS stator, which is modified by very simple technical measures such that no mechanical displacements and also no additional moving components are necessary for contactless, reliable detection of the current fitting state, wherein, however, specifically the pivotability of the MAS stator between the measuring position and the loading position, in which a MAS rotor can be inserted into the MAS stator, should additionally be maintained within a maximal angular range.

This complex object is achieved in a manner that is as surprisingly simple as it is effective in that, according to one formulation, a generic NMR-MAS probe head having the features defined at the outset comprises a detection device which makes it possible to identify contactlessly from outside whether or not the MAS stator is currently fitted with a MAS rotor, in that this detection device has a light source from which light can be introduced unto a lower end of a light guide, and in that the MAS stator has a first bore, in which a first light guide stump is positioned such that, in the loading position of the MAS stator, it produces an optical connection between a MAS rotor inserted in the MAS stator and an upper end of the light guide opposite the lower end.

The probe head according to the invention, in contrast to the design which was standard hitherto, thus has a specific optical sensor system, which enables reliable, contactless detection of the presence of the MAS rotor in the MAS stator, without the need for mechanically moved components for this purpose.

With use of an optical guide of this kind, the signals are particularly insensitive to disturbance, in particular in respect of the strong magnetic fields essential for NMR.

The pivotability of the MAS stator within an angular range of appreciable size makes it possible to insert and eject even relatively large MAS rotors. In combination with a continuous light guide, however, said light guide would be heavily mechanically loaded by the pivoting and would presumably break after just a few movements, but at any rate after only a short operating period. The physical-mechanical division of the light guide according to the invention, however, solves this problem in the probe head.

As a result of this separation according to the invention of the light path into a—substantially unmoved—light guide and the previously unknown light guide stump—pivotable together with the MAS stator—, wherein merely an optical connection, and no mechanical connection, exists between these two optical components, it is made possible without difficulty and without very great technical effort to move the stator within a relatively large angular range without the light guide possibly sustaining damage. For example, a detection of this kind would be impossible with an electrical measurement by conductor wires, because, after physical separation of electrical conductor elements, no more current would be able to flow between the individually separated conductor parts.

On account of the interrupted light guide connection, no mechanical stress is then exerted onto the light guide fibers, even if the MAS stator pivots through a large angle, and therefore the risk of the fibers breaking when a sample is changed can be eliminated. In the insertion and ejection position, the rate of rotation and also the insertion and/or ejection can be detected via the light guide by a change in the reflected brightness. A distinction between the two operating situations can be made for example on the basis of an analysis of the amplitude curve over time of the reflected signal.

Specifically due to the possibilities, afforded by the invention, of readily automatable detection of the current fitting situation of the system, the user is provided with a particularly effective tool. This possibility for detection is also a safety feature because it advises the user as to whether a rotor has become stuck during the loading process, which, as the stator pivots, could cause damage to the rotor, this being associated with loss of the measurement sample, or to the stator itself.

It should be noted expressly at this juncture that the advantages of the invention can be obtained not only in the case of vertical NMR spectrometers, but equally also in the case of NMR systems having a horizontal or inclined z-axis. The specified axial positions then no longer necessarily have to lie "above" or "below" the NMR magnet system, but instead possibly also adjacently thereto "to the right" or "to the left". In any case, the force of gravity plays a rather subordinate role with regard to the functioning of the present invention.

In a preferred embodiment of the probe head according to the invention, the detection device has a light-sensitive detector, which can detect light, from the lower end of the light guide, reflected by the MAS rotor. This type of detection makes it possible to "identify" the rotor, more specifically both the presence thereof as a single modification, and also the rotational movement as a periodic change.

Advantageous developments of these embodiments are characterized in that an analysis unit is provided which can analyze the signals of the light-sensitive detector and can thus determine whether or not the MAS stator is currently fitted with a MAS rotor. With the presence detection it is possible to ensure that the rotor is correctly in position when the stator is moved into the NMR measuring position at the MAS angle. Otherwise, there would be a risk of mechanical damage, for example if the rotor were tilted in an intermediate position.

Further, preferred embodiments of the probe head according to the invention provide that the pivotable MAS stator is held mechanically in such a way that it can be moved from the measuring position into the loading position through a pivot angle $\gamma \geq 3°$, preferably $\gamma > 35°$. This affords the possibility, in a simple way, on the one hand of being able to load the rotor and on the other hand of being able to operate the rotor in a manner rotating at the magic angle.

In one class of advantageous embodiments of the probe head according to the invention, the MAS stator has a second bore, in which a second light guide stump is positioned such that, in the measuring position of the MAS stator, it produces an optical connection between an optical marking of the MAS rotor rotating in the MAS stator and the upper end of the light guide each time the optical marking of the rotating MAS rotor is moved past the upper end of the light guide. This measure likewise leads to the possibility of detecting the rotation even at the magic angle.

Advantageous developments of this class of embodiments are characterized in that the light-sensitive detector of the detection device can detect light reflected by the optical marking of the MAS rotor and reaching the lower end of the light guide, and in that the analysis unit can analyze the signals of the light-sensitive detector and, on the basis of the periodic time dependency thereof, can determine the frequency at which the MAS rotor is currently rotating. A simple detection of the rotational frequency is thus in particular made possible.

A further preferred development is characterized in that the two light guide stumps have a cylindrical shape and their cylinder axes are oriented at an angle to one another that preferably corresponds to the maximum pivot angle $\gamma$ of the MAS stator from the measuring position into the loading position. A cylindrical shape of this kind can be produced relatively easily. The transmission capability is thus also provided both in the loading and in the measuring positions.

A further class of embodiments of the probe head according to the invention has proven to be particularly expedient in practice, said class being characterized in that the light guide stumps have a cylindrical shape, wherein their end facing the MAS rotor in the loaded operating state is ground flat at right angles to their cylinder axis and their other end, facing the light guide, is ground flat at an angle α obliquely to their cylinder axis. This enables a particular simplicity of the design, since both stumps are of equal dimensions. There is thus then also no risk of confusion at the time of assembly. It must merely be ensured that the inclined end is placed outwardly and the rotation is correctly selected.

In advantageous developments of this class of embodiments, the angle α is selected depending on the refractive index of the light guide stump and preferably on the maximum pivot angle γ of the MAS stator from the measuring position into the loading position. It is thus possible to design the stump with a view to optimal transmission.

The production tolerance of the angle α should preferably be at most 5%. In particular, the surfaces on the light guide stump that define the angle α should be produced with a manufacturing tolerance of approximately ±30 μm. If, specifically, the method according to the invention were to require a narrower tolerance, this would be unfavorable insofar as, for example, production tolerances and temperature expansion would have much more critical effects, that is to say the method would be much less robust. This can be easily avoided however by the measure proposed above.

Embodiments of the above-described classes can also, moreover, be combined with one another as necessary.

Specific developments of both of the above classes of embodiments are characterized in that, in the loaded operating state of the MAS rotor, the cylinder axes of the two light guide stumps are each arranged at a different angle to the cylinder axis of the MAS rotor in the MAS stator. This measure may be necessary so that in both cases light can pass from the fixed end of the light guide to the rotor bevel.

An embodiment of the probe head according to the invention in which the material of the light guide stumps is selected such that it presents a solid state in a temperature range between 100K and 470K and does not exceed a coefficient of thermal expansion of $2000*10^{-6}$/K, preferably of $100*10^{-6}$/K, is also advantageous. A calculation or design is then applicable over the specified temperature range, otherwise a heat-induced mechanical deformation could lead to an imprecise or even incorrect detection.

In addition, the material of the light guide stumps should be selected such that merely low optical damping is provided in the wavelength range of the used light, and the refractive index is <2, so that no excessive reflection occurs.

Further preferred embodiments of the probe head according to the invention are characterized in that the axis of rotation for the pivoting of the MAS stator runs through the center point of the MAS stator, and in that the center point of the MAS rotor is arranged centrally in the $B_0$ field of the NMR-MAS assembly. This results in a minimized, smallest possible spatial requirement and an optimal position in the magnetic field.

In advantageous embodiments of the invention an air gap is provided in each case between the upper end of the light guide and the end, facing said light guide upper end, of the first light guide stump in the loading position of the MAS stator, and also the end, facing said light guide upper end, of the second light guide stump in the measuring position of the MAS stator, the size of said air gap preferably being between 0.1 mm and 2 mm. It is actually this gap that in the first place enables the mechanical separation according to the invention of the light guide, whereby the wear of the light guide parts is significantly reduced. The air gap should in any case be selected to be as small as possible so that the maximum amount of light can be transmitted. The optical signal from the rotor to the detection unit can thus be transmitted from both positions of the stator to one and the same light guide.

The light guide can be quite easily fastened to a backbone of the probe head, which backbone is usually also surrounded by an HF shielding.

Furthermore, the detection device can be housed with the light source, the light-sensitive detector and the analysis unit in a pedestal box of the probe head.

The present invention provides particular advantages especially in the case of larger NMR measurement samples, in particular if the MAS stator is designed to receive a MAS rotor having a diameter >2.5 mm, preferably ≥3.1 mm.

Embodiments of the invention in which a pneumatic sample-changing system for supplying and removing a MAS rotor to/from the MAS stator is provided, which likewise contributes to the automation of the measurement preparations, are also preferred. In developments of these embodiments the pneumatic drive of the closure device can be operated with the same compressed air supply as the pneumatic sample-changing system in order to make the installation more compact and more economical.

Lastly, an embodiment in which the MAS stator is mounted rotatably in order to adjust the MAS angle is also preferred. As a result of the rotatability of the stator in the probe head, the insertion and removal of the MAS rotor can be further facilitated in the case of limited space; sharp curves are avoided. As a result of the rotatability of the stator, the angle of the stator bearing axis relative to the direction of longitudinal extent of the tube (which generally corresponds at least in close approximation to the direction of the static magnetic field in the NMR magnet) can be reduced compared with the magic angle for loading and unloading. It is particularly advantageous if the MAS stator, for fine adjustment of the MAS angle, is mounted so as to be rotatable within an angular range $\Delta\beta \leq \pm 0.5°$, in particular $\Delta\beta \leq \pm 0.2°$, preferably $\Delta\beta \leq \pm 0.1°$.

An NMR-MAS measurement assembly comprising a probe head according to the invention of the above-described kind, which assembly can also comprise an NMR magnet system and optionally a shim system and a cryostat, also falls within the scope of the present invention.

Further advantages of the invention will become clear from the description and the drawing. In accordance with the invention, the features described above and the features explained hereinafter can also each be used individually or as a plurality in any combinations. The shown and described embodiments shall be understood as not being exhaustive, but rather are exemplary in nature for the description of the invention.

BRIEF DESCRIPTION OF THE DRAWINGS

The invention is shown in the drawing and will be explained in greater detail on the basis of exemplary embodiments.

In the drawing.

DETAILED DESCRIPTION

The present invention relates to a specially modified probe head for an NMR-MAS spectrometer, in which mechanical displacements and also additional moved parts are no longer necessary for achieving contactless, reliable identification of the current fitting state of the pivotable MAS stator—that is to say for detection of the presence of the MAS rotor in the MAS stator. An NMR-MAS spectrometer of this kind generally has a temperature-controllable probe head in an NMR measurement assembly which comprises an NMR magnet system, a shim system, a turbine and a device for transporting a MAS rotor with a measurement sample from outside the NMR magnet system into the measuring position of the MAS rotor in the NMR probe head.

Figure 1:
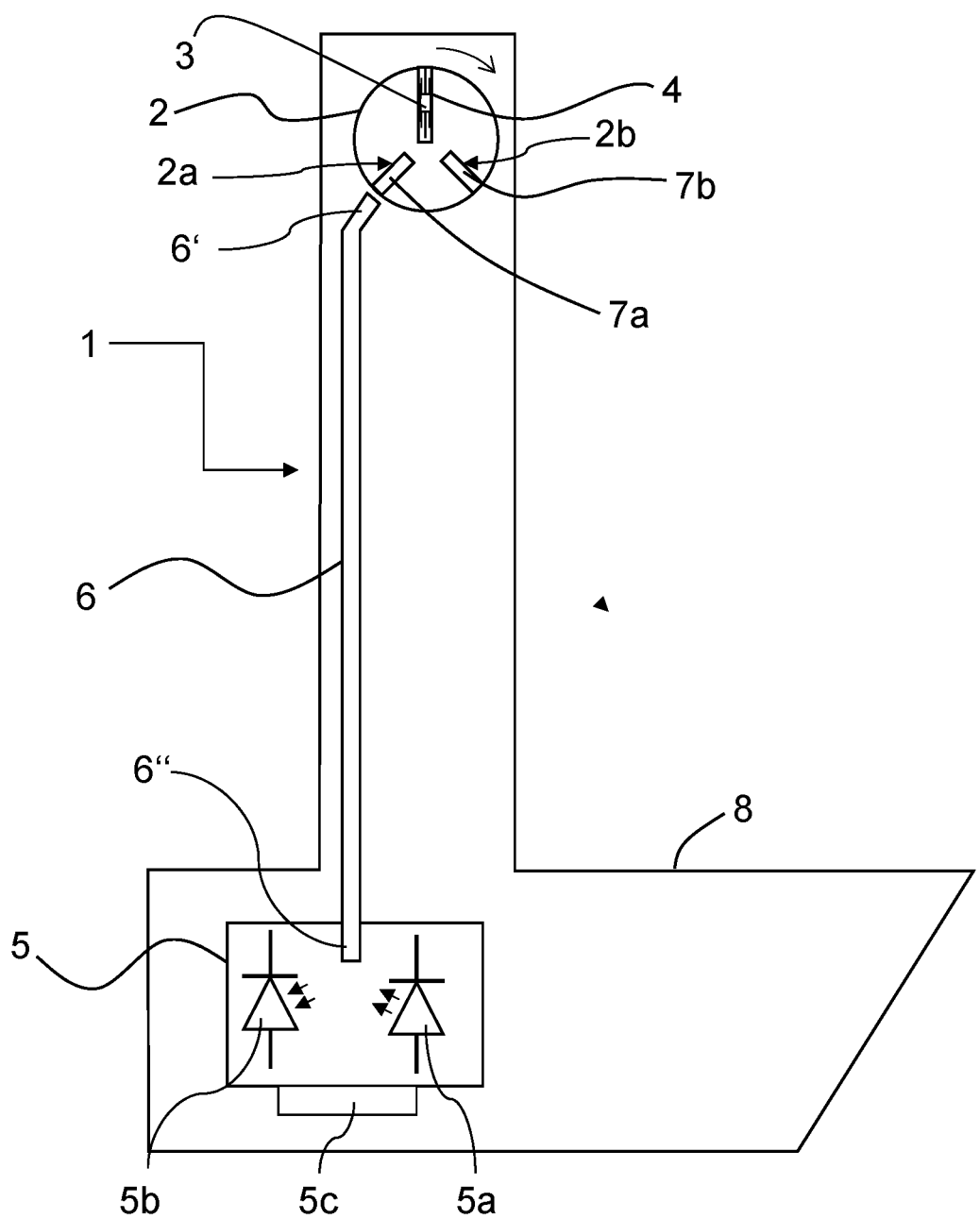
FIG. 1 shows a roughly schematic illustration of an embodiment of the probe head according to the invention in a vertical section.

FIG. 1 shows an NMR-MAS probe head 1 according to the invention in a vertical sectional plane. As shown in FIG. 1 the probe head 1 according to the invention comprises a MAS stator 2 for receiving a MAS rotor 3, which can be set in rotation in a measuring position in which the cylinder axis of the MAS rotor 3 is at the magic angle to a $B_0$ field of the NMR-MAS assembly. The MAS stator 2 has an opening 4 for inserting a MAS rotor 3 and is arranged in the NMR-MAS probe head 1 in such a way that it can be pivoted between the measuring position and a loading position, in which a MAS rotor 3 can be inserted into the MAS stator 2.

The present invention distinguishes itself from conventional assemblies according to the prior art in that the probe head 1 according to the invention—as is likewise shown schematically in FIG. 1—has a detection device 5 which makes it possible to identify contactlessly from outside the stator 2 whether or not the MAS stator 2 is currently fitted with a MAS rotor 3. Furthermore, the detection device 5 has a light source 5a, from which light can be introduced into a lower end 6" of a light guide 6. In addition, the MAS stator 2 has a first bore 2a, in which a first light guide stump 7a is positioned such that, in the loading position of the MAS stator 2, it produces an optical connection between a MAS rotor 3 inserted in the MAS stator 2 and an upper end 6' of the light guide 6 opposite the lower end 6".

Mechanical stress is thus reliably prevented from being exerted onto the light guide 6. In continuous operation the probe head 1 is thus much less susceptible to failure caused by a faulty light guide, even with more frequent changing of the measurement samples (that is to say the MAS rotors 3).

The light guide 6 can be fastened to a backbone of the probe head 1. The light guide 6 is thus protected even better against mechanical stress and is physically separate from further electronic components.

The detection device 5 of the embodiment shown is housed in a pedestal box 8 and has a light-sensitive detector 5b, which can detect light, from the lower end 6" of the light guide 6, reflected by the MAS rotor 3. In addition, an analysis unit 5c is provided which can analyze the signals of the light-sensitive detector 5b and can thus determine whether or not the MAS stator 2 is currently fitted with a MAS rotor 3.

The MAS stator 2 in this embodiment has a second bore 2b, in which a second light guide stump 7b is positioned such that, in the measuring position of the MAS stator 2, it produces an optical connection between an optical marking 9 of the MAS rotor 3 rotating in the MAS stator 2 and the upper end 6' of the light guide 6 each time the optical marking 9 of the rotating MAS rotor 3 is moved past the upper end 6' of the light guide 6.

Figure 2A:
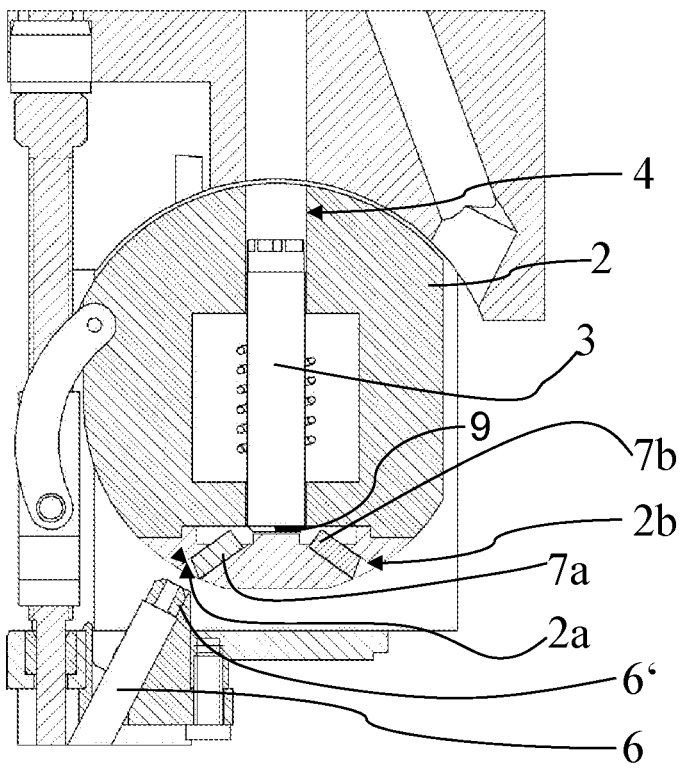
FIG. 2A shows a schematic cross-sectional illustration through the stator-rotor region of an NMR-MAS probe head according to the invention in the loading position of the MAS stator.
Figure 2B:
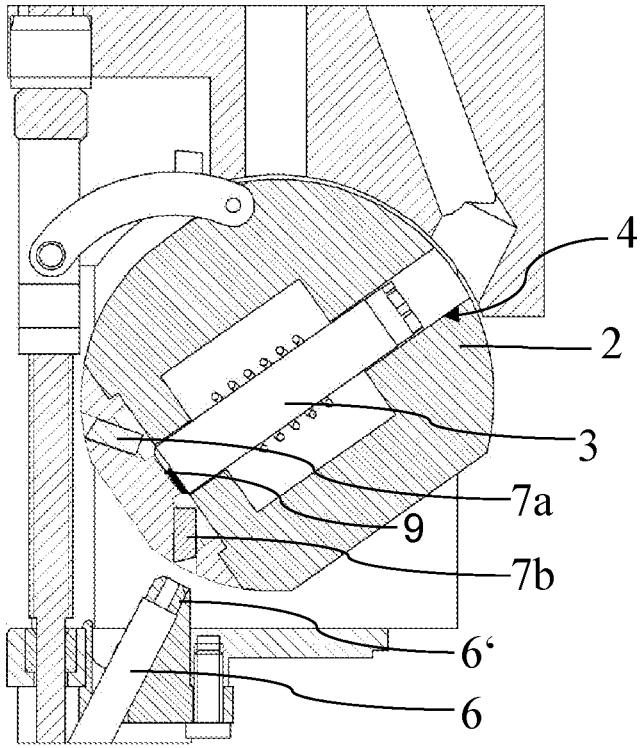
FIG. 2B shows the same as FIG. 2A, but in the measuring position of the MAS stator.

FIGS. 2A and 2B show a cross section—which is vertical in the case of vertically arranged NMR systems—of the upper end of an embodiment of the probe head 1 according to the invention in greater detail.

Figure 3A:
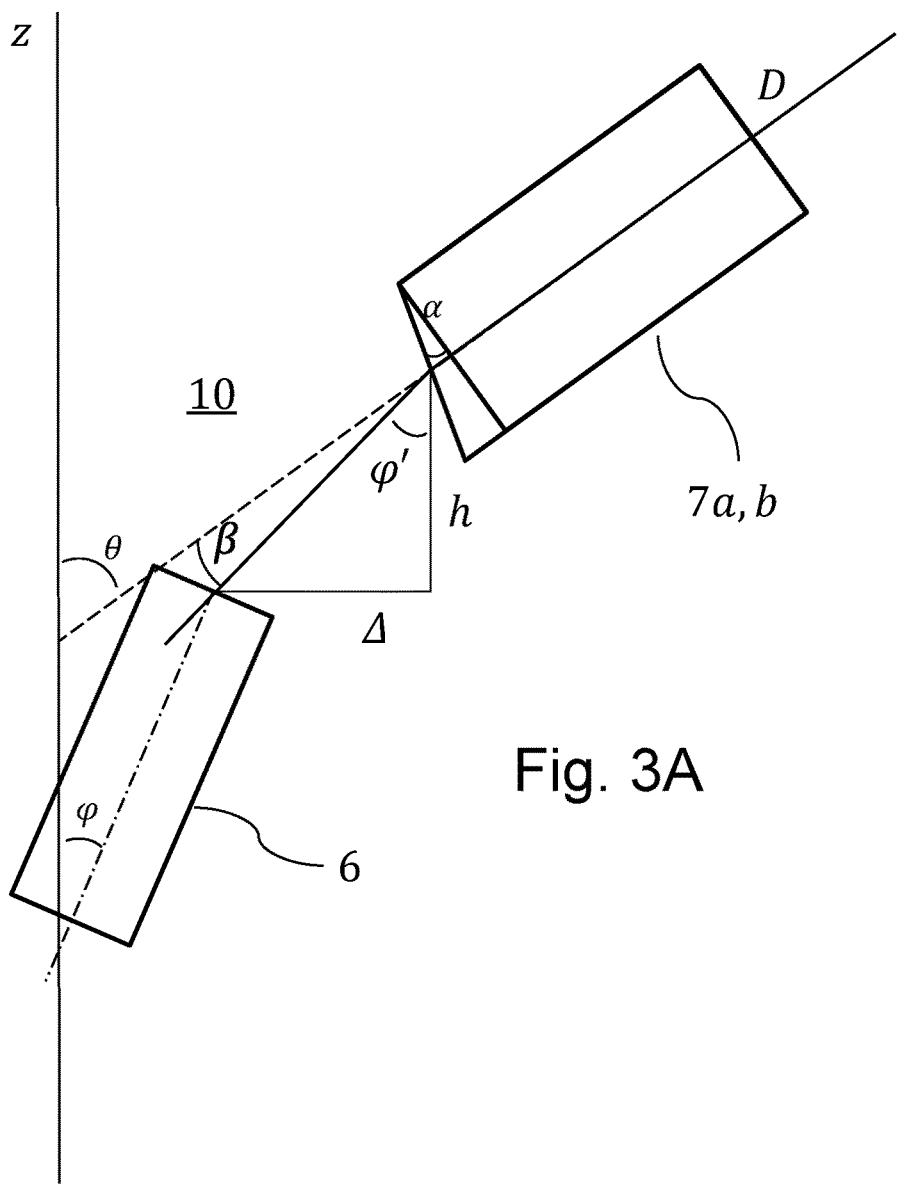
FIG. 3A shows a schematic, enlarged illustration of the region between the upper end of the light guide and a light guide stump, separated therefrom by an air gap, in a probe head according to the invention.

In the loading position shown in FIG. 2A the opening 4 in the MAS stator 2 points vertically upwardly, that is to say at an angle of 0° to the z-axis of the NMR assembly. The first light guide stump 7a, in this position, can close an optical connection between the MAS rotor 3 and the light guide 6 via an air gap 10—shown in greater detail in FIG. 3A—by way of the first light guide stump 7a. In this position it is possible to optically detect the loading state of the MAS stator 2 contactlessly. This is achieved by reflection of a light beam, emitted by the light source 5a of the detection device 5, at the MAS rotor 3, wherein the reflected light is guided back to the detection device 5 via the light path shown.

In the measuring position shown in FIG. 2B the MAS stator 2 is rotated such that the MAS rotor 3 is brought into the magic angle of 54.74° to the z-axis. In this measuring position the optical connection from the MAS rotor 3 to the detection device 5 via the air gap 10 and the light guide 6 is closed via the second light guide stump 7b, whereby it is made possible to measure the rotational speed of the MAS rotor 3 during the NMR measurement mode. This is achieved in the conventional ways by the optical marking 9 of part of the MAS rotor 3. The analysis unit 5c of the detection device 5 then converts the received light signals, which vary over time, into a count rate which in turn corresponds to the current rotational frequency of the MAS rotor 3.

The pivotable MAS stator 2 is mechanically held such that it can be moved from the measuring position into the loading position through a pivot angle $\gamma \geq 3°$, preferably $\gamma > 35°$.

The two FIGS. 2A and 2B together show how the MAS stator 2 is pivotable into the two positions, that is to say the loading position and the measuring position. At the same time the optical contact between the two light guide stumps 7a, 7b and the upper end 6' of the light guide 6 can be identified in each position respectively.

These figures also show a preferred embodiment of the device according to the invention, in which specifically the center point of the MAS rotor 3 is also simultaneously the axis of rotation for the pivoting movement. The loading state can be detected directly on the basis of the measurement of light reflections with the MAS rotor 3 inserted in the MAS stator 2. A rotational speed is measured with the aid of the optical marking 9 at the bottom or at the bottom cap of the MAS rotor.

If the light guide stumps 7a, 7b are oriented at an angle to one another, wherein this angle corresponds exactly to the angle of rotation of the MAS stator 2, it is possible for the beam path to lead perpendicularly from the light guide stump 7a or 7b to the rigid light guide 6, through the air gap 10. If, for example, a loading state of 0° (vertical loading of the rotor) is selected and pivoting about the magic angle into the measuring position is then performed, the two light guide stumps 7a, 7b could be arranged at an angle of 54.74° to one another when these point towards the center of rotation of the MAS stator 2. In this case the beam path runs perpendicularly through the air gap 10.

Figure 3B:
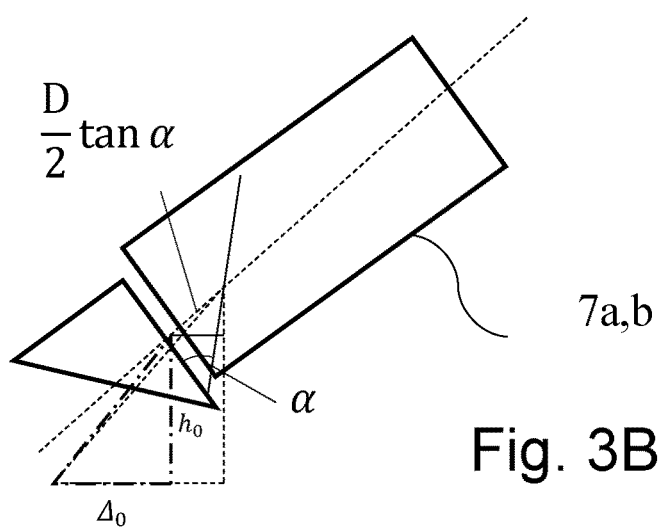
FIG. 3B shows a schematic enlarged illustration of a light guide stump that has been ground specially at its light guide-side end.

The stator center point, however, is usually selected as axis of rotation, and the rotor center point is central in the $B_0$ field. The above-described situation would only be achievable if the marking for optical detection were arranged in the middle of the rotor. In a preferred embodiment of the invention according to FIGS. 3A and 3B, the light guide stump 7a, 7b is therefore provided with a slanted grinding at an angle α relative to the central axis of the light guide stump. The chamfer is used to split the light beam in the transition through the air gap 10 in the direction of the light guide 6, such that it is transmitted as far as possible with maximum intensity.

The transition of a light beam through media having different refractive indices (for example air, light guide material) follows the law of refraction.
In the example of the drawing the following is true for predefined values h,Δ:

$$\varphi' = \arctan \Delta/h \text{ and } \beta + \varphi' = \theta + \alpha$$

$$\alpha = \arcsin(\sin \beta / n\alpha),$$

wherein nα is the refractive index of the light guide material and the refractive index of air is n=1.
At 4 mm MAS the following values should be predefined:

| | |
|---|---|
| Ø OF adapter | l = 1.5 mm |
| initial offset lateral | Δ0 = 0.77 mm |
| initial offset vertical | h0 = 0.95 mm |
| magic angle | 54.74° |
| refractive index (core) | n = 1.62 |
| ground angle | α = 18.8° |
| angle of the OF | φ = 27.37° = MA/2 |
| angle of the OF adapter | θ = 54.37° |

The ground angle is thus dependent on the refractive index of the light guide, on the rotary angle of the stator, and on the arrangement of the two light guide stumps. The tolerance of the ground angle, converted to an accuracy of the offset of 5%, would correspond to a value range of ±30 μm, which is readily complied with in practice. The tolerance range could then be 5%. It is true in principle that the ground angle is such that the emitted and received light beam is transmitted as far as possible to the optical axis of the light guide and light guide stump.

As a result of the grinding it can also be achieved that the two stumps do not necessarily have to be arranged at the same angle to the rotor, because the light guidance via the air gap can be adapted accordingly with a different grinding.

LIST OF REFERENCE SIGNS 1 probe head
2 MAS stator
2a first bore
2b second bore
3 MAS rotor
4 opening for inserting a MAS rotor into the MAS stator
5 detection device
5a light source
5b light-sensitive detector
5c evaluation unit
6 light guide
6' upper end of the light guide
6" lower end of the light guide
7a first light guide stump
7b second light guide stump
8 pedestal box
9 optical marking
10 air gap

LIST OF REFERENCES

Publications considered for the assessment of patentability:
[1] DE 10 2013 201 110 B3
[2] EP 3 093 679 B1
[3] DE 10 2014 201 076 B3
[4] U.S. Pat. No. 7,915,893 B2

What is claimed is:
1. A probe head of a Nuclear Magnetic Resonance (NMR) Magic Angle Spinning (MAS) assembly comprising:
a MAS stator having an opening configured to receive a MAS rotor in a loading position and to set the MAS rotor, which has a cylinder axis, in rotation in a measuring position in which the cylinder axis of the MAS rotor is at the magic angle to a $B_0$ field of the NMR-MAS assembly, wherein the MAS stator is arranged in the NMR-MAS probe head to pivot between the measuring position and the loading position,
a detection device configured to identify from outside the opening and without contacting the MAS rotor whether or not the opening of the MAS stator is fitted with the MAS rotor, and
a light guide having a lower end and an upper end opposite the lower end,
wherein the detection device comprises a light source configured to introduce light into the lower end of the light guide,
wherein the MAS stator has a first bore, in which a first light guide stump is positioned such that, in the loading position of the MAS stator, the first light guide stump produces an optical connection between the MAS rotor when inserted in the opening of the MAS stator and the upper end of the light guide.

2. The probe head as claimed in claim 1, wherein the detection device has a light-sensitive detector arranged to detect light, from the lower end of the light guide, reflected by the MAS rotor when the MAS rotor is inserted in the opening of the MAS stator.

3. The probe head as claimed in claim 2, further comprising an analysis unit configured to analyze signals of the light-sensitive detector and to determine whether or not the opening of the MAS stator is fitted with the MAS rotor.

4. The probe head as claimed in claim 1, wherein the pivotable MAS stator is held mechanically to move from the measuring position into the loading position through a pivot angle γ≥3°.

5. The probe head as claimed in claim 4, wherein the pivotable MAS stator is held to move from the measuring position into the loading position through a pivot angle γ>35°.

6. The probe head as claimed in claim 1, wherein the MAS stator has a second bore, in which a second light guide stump is positioned such that, in the measuring position of the MAS stator, the second light guide stump produces an optical connection between an optical marking of the MAS rotor when the MAS rotor is inserted in the opening of the MAS stator and is rotating in the MAS stator and the upper end of the light guide when the optical marking of the MAS rotor, when rotating, moves past the upper end of the light guide.

7. The probe head as claimed in claim 6, further comprising an analysis unit configured to analyze signals of the light-sensitive detector and to determine whether or not the opening of the MAS stator is fitted with the MAS rotor,
wherein the detection device has a light-sensitive detector arranged to detect light, from the lower end of the light guide, reflected by the MAS rotor when the MAS rotor is inserted in the opening of the MAS stator,
wherein the light-sensitive detector of the detection device is arranged to detect light reflected by the optical marking of the MAS rotor when the MAS rotor is inserted in the opening of the MAS stator and reaching the lower end of the light guide, and
wherein the analysis unit is configured to analyze the signals of the light-sensitive detector and, based on a periodic time dependency of the signals, to determine a rotation frequency of the MAS rotor when the MAS rotor is inserted in the opening of the MAS stator.

8. The probe head as claimed in claim 6, wherein the first and the second light guide stumps have respective cylindrical shapes and respective cylinder axes oriented at an angle to one another that corresponds to a maximum pivot angle $\gamma$ of the MAS stator from the measuring position into the loading position.

9. The probe head as claimed in claim 6, wherein the first and the second light guide stumps have respective cylindrical shapes, wherein respective one ends of the light guide stumps facing the MAS rotor in the loaded operating state are ground flat at right angles to the respective cylinder axes, and wherein respective other ends of the light guide stumps facing the light guide are ground flat at an angle $\alpha$ obliquely to the respective cylinder axes.

10. The probe head as claimed in claim 9, wherein the light guide stumps have respective refractive indices, and wherein the angle $\alpha$ is selected depending on the refractive indices of the light guide stumps.

11. The probe head as claimed in claim 10, wherein the angle $\alpha$ is selected depending on the refractive indices of the light guide stumps and on a maximum pivot angle $\gamma$ of the MAS stator from the measuring position into the loading position.

12. The probe head as claimed in claim 9, wherein a production tolerance of the angle $\alpha$ is at most 5%.

13. The probe head as claimed in claim 9, wherein in the loaded operating state of the MAS rotor, the cylinder axes of the two light guide stumps are arranged at differing respective angles to the cylinder axis of the MAS rotor in the opening of the MAS stator.

14. The probe head as claimed in claim 6, wherein the light guide stumps are made of a material having a solid state in a temperature range between 100K and 470K and not exceeding a coefficient of thermal expansion of $2000*10^{-6}$/K.

15. The probe head as claimed in claim 14, wherein the coefficient of thermal expansion does not exceed $100*10^{-6}$/K.

16. The probe head as claimed in claim 1, wherein a center point of the MAS stator forms the axis of rotation for the pivoting of the MAS stator, and wherein a center point of the MAS rotor is arranged centrally in the $B_0$ field of the NMR-MAS assembly when the MAS rotor is inserted in the opening of the MAS stator.

17. The probe head as claimed in claim 1, wherein the upper end of the light guide forms respective air gaps with the end, facing the light guide upper end, of the first light guide stump in the loading position of the MAS stator, and also with the end, facing the light guide upper end, of the second light guide stump in the measuring position of the MAS stator.

18. The probe head as claimed in claim 17, wherein the respective air gaps have a size between 0.1 mm and 2 mm.

\* \* \* \* \*